331-98
SEARCH ROOM

July 6, 1965 R. L. MAYNARD 3,193,778

HIGH FREQUENCY OSCILLATOR INCORPORATING A DISTRIBUTED TUNER

Filed Oct. 1, 1962 2 Sheets-Sheet 1

Robert L. Maynard
INVENTOR.

HIGH FREQUENCY OSCILLATOR INCORPORATING A DISTRIBUTED TUNER

Filed Oct. 1, 1962

2 Sheets-Sheet 2

Robert L. Maynard
INVENTOR.

United States Patent Office 3,193,778

Patented July 6, 1965

3,193,778

HIGH FREQUENCY OSCILLATOR INCORPORATING A DISTRIBUTED TUNER

Robert L. Maynard, Nashua, N.H., assignor to Sanders Associates, Inc., Nashua, N.H., a corporation of Delaware Filed Oct. 1, 1962, Ser. No. 227,431
6 Claims. (Cl. 331—98)

This invention relates to a novel frequency modulated oscillator for high frequency electromagnetic waves. More specifically, it relates to an oscillator incorporating a distributed tuner in which the resonant frequency of a transmission line resonator is swept back and forth linearly with respect to time. The tuner includes a bifurcated rotor arranged coaxially with a similarly constructed stator. The rotor-stator assembly protrudes into the resonator, and rotation of the rotor changes the resonant frequency of the system.

Many prior art frequency-modulated, distributed tuners incorporate a tuning member coupled to a resonant transmission line and driven with a reciprocating motion to vary the resonant frequency of the line at the modulation rate. Thus, one tuner of this type incorporates a "voice coil" that moves a tuning diaphragm back and forth. Although it is often desirable that the frequency variations produced with these tuners be linear with respect to time, this is generally not the case; for example, with many constructions, the frequency varies sinusoidally as the tuning member moves.

In addition, these tuners are susceptible to microphonic noises, i.e., electrical disturbances resulting from vibrations. Moreover, the inertia of the tuning member and its drive mechanism limit the modulation frequency in frequency modulation systems incorporating the tuner, especially where a large modulation index is desired.

Further disadvantages of prior art tuners of the present type are the generally delicate structure of the tuning member and the complicated mechanism required to drive it. This results in a reliability which is insufficient for many applications.

Accordingly, it is a principal object of the present invention to provide an improved tuner having distributed reactances. A more specific object is to provide a frequency modulated oscillator incorporating a distributed tuner having the characteristics set forth below.

A further object of the invention is to provide a distributed reactance high frequency tuner that is linear.

Another object of the invention is to provide a frequency modulated tuner of the foregoing type that has a short turn around time at each end of the frequency sweep. A corollary object of the invention is to provide a tuner of the above character that utilizes a simple mechanical drive mechanism and yet is capable of a relatively large radio frequency excursion at a reasonably high modulation frequency.

Still another object of the invention is to provide a tuner of the above character that is mechanically rugged and has a simple design.

A further object of the invention is to provide a linear distributed tuner that is relatively free of microphonic noise disturbances.

Yet another object of the invention is to provide a tuner of the above type which has a high degree of reliability and is thus suitable for use in such applications as aircraft radar altimeters.

Other objects of the invention will in part be obvious and will in part appear hereinafter.

The invention accordingly comprises the features of construction, combination of elements, and arrangement of parts which will be exemplified in the construction hereinafter set forth, and the scope of the invention will be indicated in the claims.

For a fuller understanding of the nature and objects of the invention, reference should be had to the following detailed description taken in connection with the accompanying drawings, in which.

In general, a frequency modulator constructed according to the present invention has a multiple-pronged cylindrical stator that extends into a resonant transmission line. A similarly shaped rotor is rotatably mounted coaxially with the stator. Assuming a two-pronged rotor and stator, rotation of the rotor sweeps the resonant frequency of the line back and forth about a center frequency at twice the rate of rotor rotation. The modulator can readily be constructed so that the frequency variation is substantially linear with respect to the angular position of the rotor and exhibits a minimum of unwanted amplitude modulation.

The resonant transmission line is incorporated in an oscillator circuit to control the oscillator output frequency, and thus rotation of the modular rotor frequency modulates the oscillator output voltage.

Figure 1:
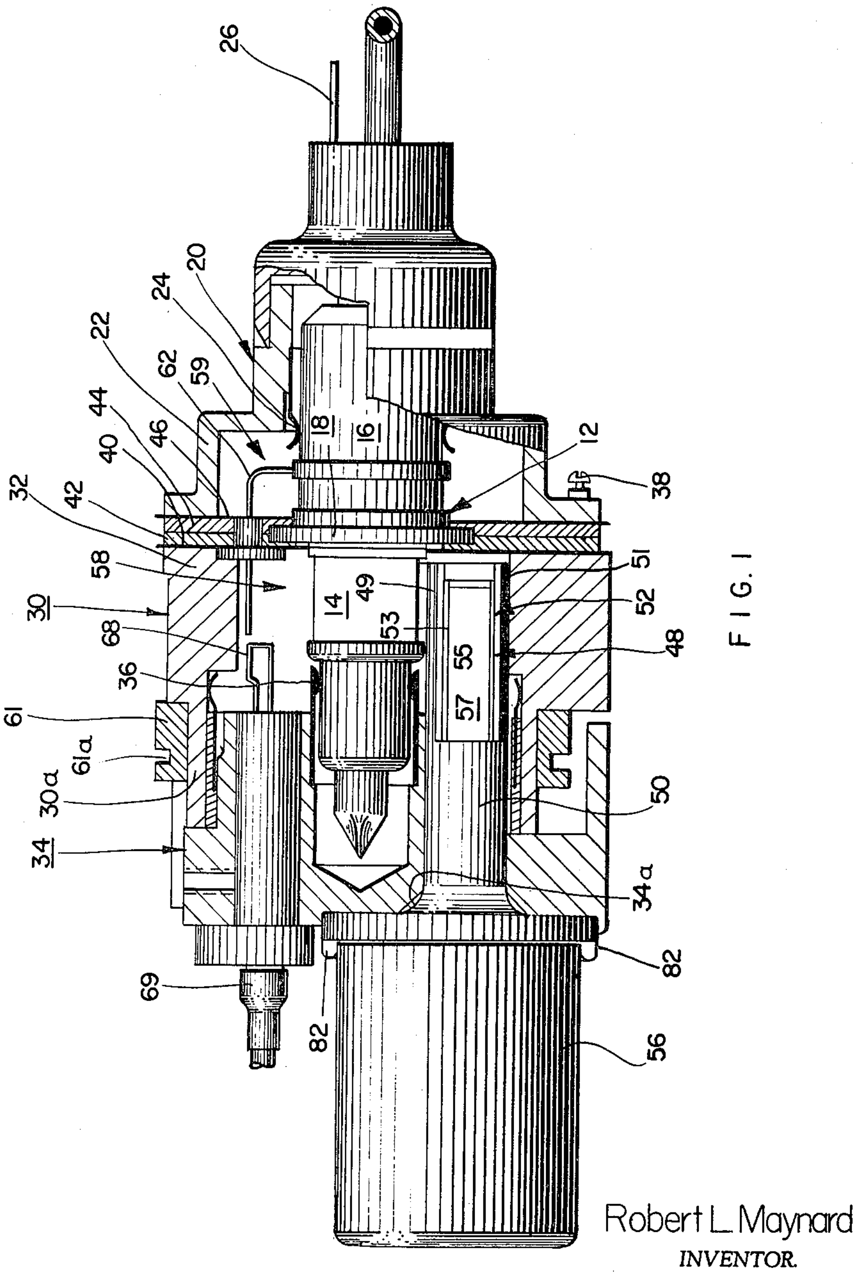
FIG. 1 is a side elevation view, partly in section, of a distributed-reactance, frequency-modulated oscillator embodying the invention.

More specifically, referring to FIG. 1, a frequency modulated oscillator embodying the invention may utilize a high frequency planar vacuum tube indicated generally at 12. The tube 12 is constructed as a triode having an anode 14, a cathode 16, and a grid 18. A conductive cathode housing indicated generally at 20 has an outer conductor 22 disposed coaxially about the cathode 16, and a cathode terminal 24 making a low resistance D.-C. and RF contact with the cathode 16 at one end of the outer conductor 22. The housing 20 also includes a terminal 26 for the heater in the tube 12.

A conductive anode housing indicated generally at 30 has an anode outer conductor 32 disposed coaxially about the anode 14 and is electrically and mechanically secured to a conductive anode block indicated at 34. The block 34 has an anode terminal 36 that makes D.-C. and RF contact with the anode 14.

Figures 2, 3:
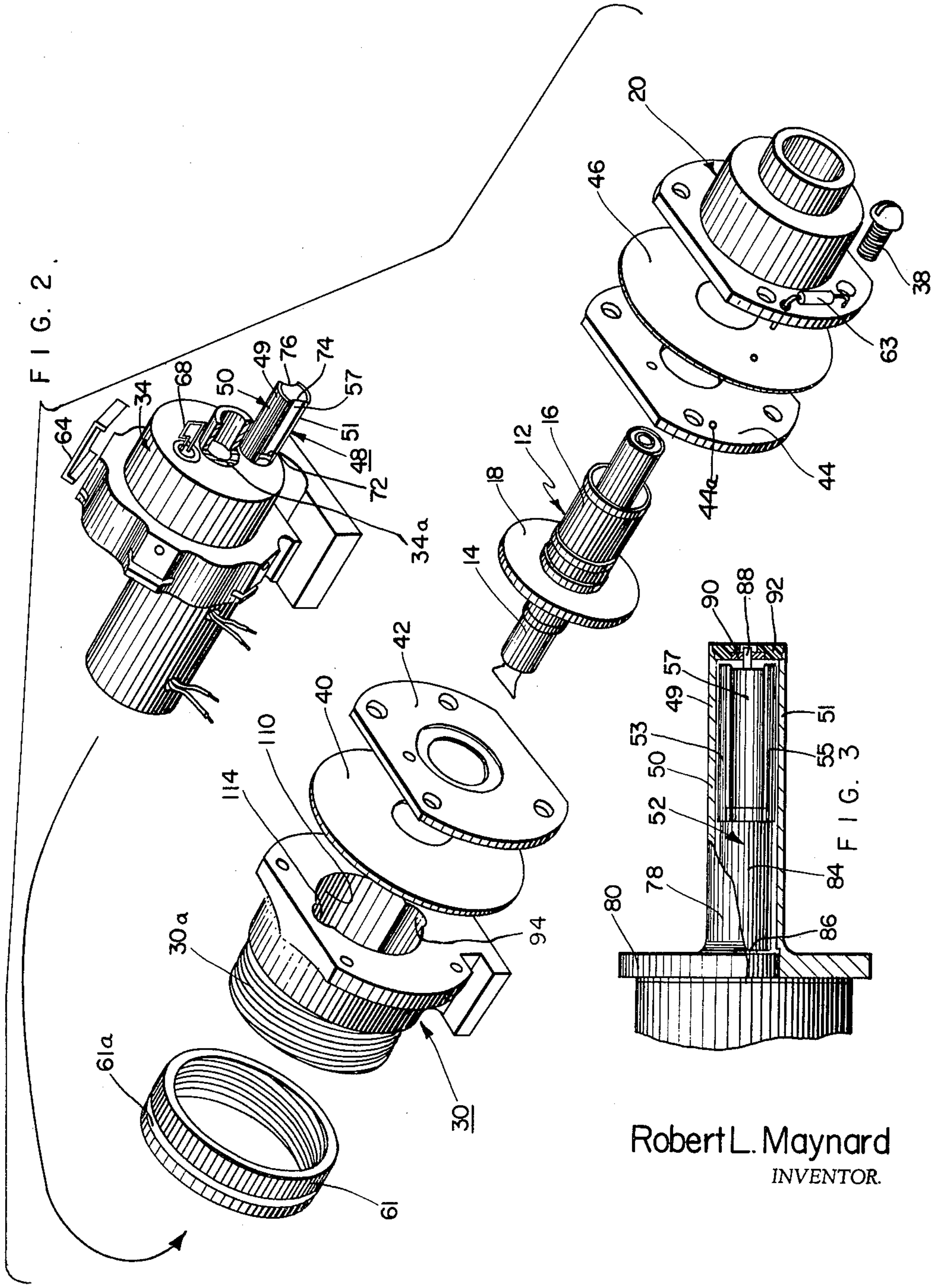
FIG. 2 is an exploded view of the oscillator of FIG. 1.
FIG. 3 is a side view, partly broken away and partly in section, of the tuning mechanism used in the oscillator.

The cathode housing 20 and the anode housing 30 may be secured together with suitably insulated machine screws 38, threaded into the anode housing 30. Clamped between the housings 20 and 30 are a grid insulator 40, a first grid supporting plate 42, the grid 18, a second grid supporting plate 44, and a grid insulator 46, as shown in FIGS. 1 and 2. The plates 42 and 44 support the tube 12, and the insulators 40 and 46 provide direct-current electrical isolation among the grid 18, the cathode 16 and the anode 14.

As shown in FIGS. 1 and 2, a modulator, indicated generally at 48 and mounted on the anode block 34, has a stator 50 that extends through an aperture 34*a*, into the space between the anode 14 and the outer conductor 32. As detailed below, the stator 50 is a hollow cylinder, bifurcated to form two arcuate pole pieces 49 and 51. The modulator 48 also includes a rotor 52, having a pair of arcuate prongs 53 and 55, coaxial with and rotatably mounted within the stator 50. The prongs 53 and 55 are closely spaced from the pole pieces 49 and 51 when in register therewith. The rotor is secured to the shaft of a motor 56. A dielectric member 57 may be secured between the rotor prongs. As best seen in FIG. 1, the stator 50 is closely spaced from both the outer conductor 32 and the anode 14.

A direct-current source (not shown) is connected between the anode housing 30 and the cathode housing 20 to apply a direct voltage between the tube anode 14 and the cathode 16. With this construction, the oscillator 10 operates as a grid return oscillator. An oscillator of this general type, now well known to those skilled in the art, is described at pages 720–727 of Principles of Radar, published in 1952 by the McGraw Hill Book Company of New York.

More specifically, one resonant circuit for the oscillator is the shorted end coaxial transmission line or cavity 59 formed by the cathode 16 and the cathode outer conductor 22. This cathode line is terminated with a low impedance at a distance from the grid 18 which is slightly greater than a quarter wavelength at the operating frequency of the oscillator. The low terminating impedance, ideally a short circuit, is provided by the cathode terminal 24 connecting the cathode housing 22 with the cathode 14. The capacitance between the plate 44 and the housing 22, provided by the grid insulator 46, couples the cathode transmission line 59 between the grid 18 and the cathode 16.

Moreover, the outer conductor 32 and the tube anode 14 form a shorted end anode transmission line or cavity 58 that is capacitively coupled through the grid insulator 40, between the tube grid 18 and the anode 14. This anode transmission line is terminated by a low impedance at a distance from the grid 18 effectively equal to a quarter wavelength (or odd multiple thereof) at the operating frequency. The low impedance termination, ideally a short circuit, is provided by the anode terminal 36 connecting the anode block 34 with the anode 14.

Tuning of the oscillator is accomplished by means of a collar 61 threaded onto the anode housing 30 at **30*a*. The collar 61 has a groove 61*a* engaged by cleats 64 secured to the block 34. Thus, as the collar 61 is turned on the thread 30*a*, it moves the block 34 in the axial direction. As seen in FIG. 1, such movement lengthens or shortens the resonant line 58**, thereby changing its resonant frequency.

A wire 62 connected to the tube cathode 16 extends through holes in the grid support plates 44 and 46 and into the anode transmisison line 58 to increase the capacitance between the anode and the cathode. In addition, a grid resistor 63 (FIG. 2) is connected at one end to the cathode housing 20 and at the other to the tube grid 18. The latter connection is made at **44*a* on the plate 44**.

With further reference to FIGS. 1 and 2, the output of the oscillator is coupled from the anode transmission line 58 by means of a radially oriented loop 68. The loop is connected to a coaxial receptacle shown at 69 in FIG. 1.

When the motor 56 is operated to rotate the modulator rotor 52, the resonant frequency of the anode transmission line 58 changes, causing the frequency of the oscillator to vary periodically. More specifically, when the rotor prongs 53 and 55 are in register with the stator pole pieces 49 and 51, the frequency is at a minimum. When the rotor is displaced 90° from this position, the frequency has its maximum value. Because of the symmetry of the modulator 48, the frequency is the same for every pair of rotor angles spaced apart by 180°. Thus, the frequency undergoes two sweep cycles, between its highest and lowest values, for each full revolution of the rotor.

The constructional details of the modulator will best be understood by references to FIGS. 2 and 3. With reference first to FIG. 2, the prongs 53 and 55 are seen to extend from base 72. The base and the insulating member 57 may be arcuately cut away along surfaces 74 and 76, as shown, a shape which results from formation of the prongs 53 and 55 by milling away portions of a tube containing the member 57.

As shown in FIG. 3, the stator 50 includes a tubular extension 78 supporting the pole pieces 49 and 51 from an integral base plate 80. The base plate, which also supports the motor 56, is secured to the anode block 34 (FIG. 1) by bolts 82.

With further reference to FIG. 3, the rotor 52 includes a coupling shaft 84 of insulating material, extending from the base 72 and connected to the motor shaft 86. At the other end of the rotor, a shaft 88 is journaled in a jewel bearing 90. The bearing 90, in turn, is carried in a dielectric button 92, press fitted into the end of the stator 50.

The stator pole pieces 49 and 51 and the rotor prongs 53 and 55 preferably extend 90° in the circumferential direction. This enhances linearity of operation by minimizing the "turn around" or "dead space" encountered when the prongs are disposed in register with the pole pieces and when they are displaced 90° from this position. Also, the pole pieces preferably are both parallel to the transmission line 58 and substantially tangential to cylinders coaxial with the line. With this arrangement, the variation of oscillator frequency with angular position of the rotor is linear within ten percent.

Moreover, a large frequency deviation is obtainable with the modulator 48, an important factor in the accuracy of FM altimeters using the oscillator. For example, a frequency deviation of 100 megacycles on each side of a center frequency of 1600 megacycles is readily obtainable. The deviation is a function of the length of the modulator 48 projecting into the anode transmission line 58; the greater the projection, the greater the frequency deviation. To provide for adjustment of frequency deviation, the bolts 82 may be secured to the base plate 80, e.g., by means of snap rings. Rotation of the bolts will then move the modulator into or out of the line 58.

In a typical oscillator having a central frequency of 1630 megacycles and using a type 6771 planar triode as the tube 12, the outer conductor 32 of the transmission lines 58 has an inner diameter of one inch. The stator pole pieces 49 and 51 of the modulator 48 have a length of 0.7 inch within the line 58, a thickness of 0.02 inch, and an inner diameter of 0.26 inch. The prongs 53 and 55 of the rotor 52 have a length of 0.06 inch, a thickness of 0.02 inch, and an outer diameter of 0.25 inch. The length of the transmission line is such as to provide resonance at the center frequency when the rotor 52 is in center-frequency position. As shown in FIG. 2, the stator 50 is disposed in a groove 94 in the conductor 32, with the surface of the groove spaced .020 inch from the stator.

With these dimensions, the oscillator has a deviation of 50 megacycles on each side of the center frequency. The amplitude modulation is less than 1 db (ratio of maximum to minimum power). Moreover, the linearity is good, as mentioned above, and the "dead space" or "turn around" angle at each end of the frequency sweep is less than 3% of the full circle of rotation.

It will thus be seen that the objects set forth above, among those made apparent from the preceding description, are efficiently attained and, since certain changes may be made in the above construction without departing from the scope of the invention, it is intended that all matter contained in the above description or shown in the accompanying drawing shall be interpreted as illustrative and not in a limiting sense.

It is also to be understood that the following claims are intended to cover all of the generic and specific features of the invention herein described, and all statements of the scope of the invention, which, as a matter of language, might be said to fall therebetween.

What is claimed is:

1. A high frequency oscillator comprising (a) an electron tube having a cathode, an anode and a grid, (b) said tube being connected in a distributed reactance circuit including (1) a resonant anode transmission line having a first outer conductor enclosing said anode, and (2) a cathode transmission line having a first outer conductor enclosing said cathode, (c) a tuning mechanism comprising a stator and a rotor, (d) said stator comprising a plurality of elongated pole pieces extending longitudinally with respect to said anode transmission line and between said anode and said first outer conductor, (e) said pole pieces being spaced apart around a longitudinal axis and having circumferential surfaces equally spaced from said axis, (f) said rotor having a plurality of longitudinally extending prongs radially spaced from said stator surfaces with respect to said axis, and (g) means for rotating said rotor about said axis.

2. The combination defined in claim 1 in which (a) said stator surfaces are disposed on a first cylinder centered on said axis, and (b) said rotor prongs have surfaces facing said stator surfaces and disposed on a second cylinder concentric with said first cylinder and closely spaced therefrom.

3. The combination defined in claim 2 in which (a) said stator surfaces are equal in arcuate extent, (b) said stator surfaces are equally spaced apart, and (c) the arcuate extent of each of the spaces between said stator surfaces is equal to the arcuate extent of each of said stator surfaces.

4. The combination defined in claim 3 in which (a) the number of said rotor prongs is equal to the number of said pole pieces, (b) said rotor surfaces having the same arcuate extent as to said stator surfaces, and (c) the spaces between said rotor surfaces having the same arcuate extent as said rotor surfaces.

5. The combination defined in claim 2 in which (a) the number of said pole pieces is two, and (b) the number of said rotor prongs is two.

6. In a distributed-reactance source for producing a frequency modulated signal, the combination comprising (a) a resonant coaxial transmission line having an inner conductor coaxially disposed within an outer conductor, (b) means forming an axial groove in said outer conductor, (c) a conductive hollow cylinder bifurcated to form two diametrically opposed pole pieces, (d) each pole piece having an arcuate extent of substantially 90°, (e) said cylinder being secured to said outer conductor at a point remote from said pole pieces, (f) said cylinder being disposed in said transmission line (1) with said pole pieces extending parallel to said inner and outer conductors, and (2) with one pole piece disposed in said groove, (g) a conductive rotor having a pair of elongated arcuate prongs diametrically opposed with respect to the axis of said stator, (h) each of said prongs having an arcuate extent of 90° around said axis, (i) said rotor being mounted coaxially within and insulated from said cylinder for rotation about said axis to change the resonant frequency of said transmission line.

References Cited by the Examiner

UNITED STATES PATENTS

| | | | |
|---|---|---|---|
| 2,261,879 | 11/41 | Higgins | 331—178 |
| 2,597,993 | 5/52 | Hetland | 331—178 |
| 2,966,635 | 12/60 | Schachter | 331—98 |

ROY LAKE, *Primary Examiner.*

JOHN KOMINSKI, *Examiner.*